United States Patent [19]
Sani-Bakhtiari et al.

[11] Patent Number: 6,152,353
[45] Date of Patent: Nov. 28, 2000

[54] PRINTED CIRCUIT BOARD HEADER ATTACHMENT STATION

[75] Inventors: Paymon Sani-Bakhtiari; David Lekx, both of Toronto, Canada

[73] Assignee: Celestica International Inc., Toronto, Canada

[21] Appl. No.: 09/245,125

[22] Filed: Jan. 14, 1999

[51] Int. Cl.[7] .......................... B23K 31/02; B23K 31/00
[52] U.S. Cl. .................................. 228/180.1; 228/180.2; 228/180.21
[58] Field of Search .................... 228/6.2, 44.3, 228/44.7, 49.1, 49.5, 5.5, 180.1, 180.2, 180.21

[56] References Cited

U.S. PATENT DOCUMENTS

| | | | |
|---|---|---|---|
| 3,582,610 | 6/1971 | Eckles et al. | 219/209 |
| 3,735,911 | 5/1973 | Ward | 228/19 |
| 3,791,018 | 2/1974 | Johnston et al. | 29/471.1 |
| 3,961,413 | 6/1976 | Noe | 29/569 R |
| 4,160,893 | 7/1979 | Meyen et al. | 219/85 BA |
| 4,504,008 | 3/1985 | Kent et al. | 228/180.2 |
| 4,568,819 | 2/1986 | Stacconi | 219/227 |
| 4,654,507 | 3/1987 | Hubbard et al. | 219/233 |
| 4,752,025 | 6/1988 | Stach et al. | 228/9 |
| 4,756,077 | 7/1988 | Bianchi | 29/740 |
| 4,851,648 | 7/1989 | Jacobs et al. | 219/85.16 |
| 4,855,559 | 8/1989 | Donner | 219/85.16 |
| 4,909,428 | 3/1990 | Mermet-Guyennet | 228/6.2 |
| 5,068,508 | 11/1991 | Phalon, Jr. et al. | 219/85.16 |
| 5,090,609 | 2/1992 | Nakao et al. | 228/123 |
| 5,150,827 | 9/1992 | Fries | 228/44.7 |
| 5,188,280 | 2/1993 | Nakao et al. | 228/123 |
| 5,516,031 | 5/1996 | Nishikawa et al. | 228/205 |
| 5,639,011 | 6/1997 | Jacks et al. | 228/180.21 |
| 5,660,318 | 8/1997 | Jung et al. | 228/102 |
| 5,785,237 | 7/1998 | Lasto et al. | 228/180.22 |

Primary Examiner—Patrick Ryan
Assistant Examiner—Zidia T. Pittman
Attorney, Agent, or Firm—Blake, Cassels & Graydon, LLP

[57] ABSTRACT

The printed circuit board (PCB) header attachment station mounts a header (PCB) onto a PCB having pre-existing solder joints, such as underneath a direct mount IC chip. The apparatus applies a soldering paste to PCB lands configured to receive the pins of the header; nests the header component in stacked alignment with the PCB in order to bring the header pins into contact with the respective PCB lands; heats the PCB to a temperature approaching the reflow temperature of the solder in the pre-existing PCB solder joints; and actuates a compliant heating block or bar to heat the header pins to an extent sufficient for the pins to conduct enough heat to locally reflow the solder on the corresponding PCB lands without reflowing the solder in the pre-existing solder joints. The local reflow of the solder precludes solder reflow in the surrounding pre-existing joints which may coalesce under the direct mount IC chip and render the PCB defective.

16 Claims, 12 Drawing Sheets

PRINTED CIRCUIT BOARD HEADER ATTACHMENT STATION

FIELD OF INVENTION

The invention generally relates to the art of printed circuit board (PCB) manufacture and more particularly to the manufacture of a PCB having a stacked header component.

BACKGROUND OF INVENTION

Many techniques are employed in the manufacture of PCBs in order to increase component density and reduce the area and/or size of the PCB. The exploded view of FIG. 1 shows the results of one such technique in which an integrated circuit (IC) semiconductor chip 20 is directly mounted onto a PCB 22 using a "direct chip attach" process. In this process, a solder mask is placed on an etched or coined PCB and solder paste is screened onto the copper lands of the PCB. The PCB 22 is then stuffed with components, including IC chip 20. The IC chip 20 is not housed in a chip carrier or any other kind of package and thus is able to occupy a minimal footprint on one side the PCB 22 as compared to a fully packaged IC, e.g., one encased in a common dual in-line package (DIP). After stuffing, the PCB is heated by a heat radiation means to reflow the solder paste and electrically and mechanically connect the components to the PCB. The PCB is then washed to remove excess solder flux. Thereafter components such as the IC chip 20 are wire-bonded directly to the PCB. After wire-bonding and a potential testing phase, an encapsulant 24 is applied to the IC chip 20 and possibly other components in order to hermetically seal these components from the external environment.

In the illustrated embodiment the PCB 22 includes a copper backplane 25 which provides a low profile means for dissipating heat. In circumstances where the IC chip 20 produces significant operating heat it is directly attached to the backplane 25 for efficient heat transfer. The encapsulant 24 protects the chip and wirebonds from the surrounding environment.

The component density of the PCB 22 is also increased by stacking a header 26 onto the PCB 22 after the encapsulant 24 is applied. The header 26 may carry on its underside 28 relatively large electronic components such as inductors 30 thereby eliminating the need to reserve a relatively large footprint on the PCB 22 for these bulky components. The header 26 includes a number of friction-fitted pins 32. A portion 32B of the pins extend from the underside 28 of header 26 for mounting it onto respective header pin lands 34 located on the PCB 22. Some of the pins 32 and correspondingly some of the lands 34 serve to electrically interconnect the inductors 30 to the circuitry of the PCB. A portion 32A of the pins 32 extend from a top-side of the header and may be used to mount the PCB/header assembly 22 and 26 to a host card or motherboard (not shown) in a larger system. In this case, some of the pins 32 and correspondingly some of the lands 34 may be electrically active and function as input/output interconnections between the PCB 22 and the host card. This feature also eliminates the need to dedicate a significant footprint of the PCB 22 for card edge connectors.

The header 26 is relatively large and may be sized as large as the PCB 22 itself as shown in FIG. 1, or may be somewhat smaller. Smaller headers may also be employed. As such, the header 26 must typically be mounted to the PCB 22 after the encapsulant 24 is applied. This creates certain thermal constraints in soldering the header pins 32 to the corresponding lands 34. The principal constraint is that solder located under the directly attached IC chip 20 should not be allowed to reflow once the encapsulant 24 is applied. This is because the chemical composition and temperature profile of solder paste changes after the first reflow. The solder underneath the chip 20 may contain a number of small voids which, when subsequently reflowed, may coalesce to produce a large void. A direct mount chip with a large solder void underneath it is unable to efficiently dissipate heat to the copper backplane 25 and thus will have a very short field life.

In the past, the pins 32 were hand-soldered to the PCB 22. This was a labour intensive and economically undesirable method of manufacture. The problem was exacerbated due to the thermally conductive copper backplane 25 which acted as an effective heat sink making it difficult to manually solder each pin.

Alternatively, a heat radiation and flux dispenser apparatus was employed to reflow solder (previously applied) on lands 34 in order to create a joint with the header pins 32. This apparatus was often unable to create successful joints. In cases where the lands 34 were very close to the site of the IC chip 20, e.g., less than 0.25 inches, the solder on lands 34 did not receive enough heat to reflow due to the aforementioned thermal constraint. If the heat radiation time was increased to reflow the solder on lands 34, solder would also reflow under the IC chip 20, creating unwanted voids and defective PCBs 22. The problem is exacerbated due to the rapid heat conduction properties of the thermal backplane 25 to which the IC chip 20 is directly attached.

Furthermore, in an effort to keep within the limits of the aforementioned thermal constraint, the apparatus was used to reflow only one side of the PCB 22 at a time in order to keep the temperature of the solder underneath the direct mount IC chip 20 below the solder reflow point. This uneven heating of the sides of the PCB caused header 26 to tilt and reduced the number of successfully soldered pins on the opposite side of the PCB in the following manner: One side of the PCB was heated first. Assuming that the voiding described above did not occur, the solder was reflowed on the first side and the header pins travelled downward due to gravity to touch the underlying copper-plated surface or land of the PCB on that side. However, the solder on lands on the second side of the PCB 22, being ball-like in shape, were still solid and high, causing the header 26 to tilt somewhat, with the first side down relative to the second side. The apparatus then advanced to reflow the solder on the second side of the PCB. However, the header pins 32 were high and would not travel down to meet the copper land of the PCB, since the header 26 is constructed from a solid plastic mould and the pins 32 are friction inserted into the plastic. This caused a great failure rate in the joints on the second side of the PCB.

SUMMARY OF INVENTION

Broadly speaking, the invention overcomes various problems of the prior art by employing a heat conduction, as opposed to heat radiation, approach to creating the header-PCB solder joint.

One aspect of the invention relates to a method for mounting a component having one or more pins onto a printed circuit board (PCB) having one or more respective lands for receiving the component pins. The method includes: (a) applying solder and flux, preferably in paste form, onto the lands; (b) bringing the pins in contact with the lands; (c) preheating the PCB to at least a flux-activation temperature; and (d) applying additional heat only to the pins in order for the pins to conduct sufficient heat to reflow the solder on the PCB lands.

The method may be advantageously applied to PCBs having pre-existing solder joints, such as an un-packaged IC chip directly mounted onto a copper backplane. In this case the PCB is heated in step (c) to a temperature approaching but not reaching the reflow temperature of the solder in the pre-existing joints, and in step (d) heat is applied so that the pins conduct only enough heat to locally reflow the solder on the lands without reflowing the solder in the pre-existing solder joints.

In the preferred embodiment the component is a header and its pins are exposed on top and bottom sides of the header. The top portions of the pins provide contact points for a heating element and the bottom portions of the pins provide a part for assembly onto the PCB.

The apparatus according to the preferred embodiment includes a nest for locating the header and the PCB in stacked alignment. A top and bottom heater apply heat to the PCB. The bottom heater receives the nest and provides a general heating of the PCB to at least a flux-activation temperature but less than the reflow temperature of the preexisting solder joints. The top heater includes a top heating block connected to an actuating mechanism such as a piston for bringing the heating block into contact with the exposed header pins for a time sufficient for the pins to conduct enough heat to locally reflow the solder on the lands.

In the preferred embodiment the top heating block is resiliently suspended from the actuating mechanism in order to reduce the impact between the heating block and the header pins. Thermally insulative material such as a ceramic shield is disposed between the heating block and the actuating mechanism in order to reduce heat transfer.

The heating block preferably features a stabilizer member resiliently suspended therefrom. The stabilizer member contacts and applies a light pressure onto the header in order to stabilize it prior to the heating block contacting the header pins. The stabilizer member also assists in stabilizing the header, whose recently formed solder joints are still substantially liquid, as the top heating block is retracted.

The heating block preferably features a plurality of teeth resiliently suspended therefrom, with each tooth being configured for separate contact with an individual header pin. This enables the heating block to comply to variations in the heights of the header pins.

The apparatus according the preferred embodiment further includes a conveyor having a moving element for transporting the nest underneath the top heater. The bottom heater is embedded in the conveyor moving element. The nest is located on a carrier tray and the conveyor moving element is keyed to locate the carrier tray thereon. Lifters are also disposed proximate to a terminating end of the conveyor for raising the carrier tray off of the hot bottom heater in order to cool the former without operator intervention.

BRIEF DESCRIPTION OF DRAWINGS

The foregoing and other aspects of the invention are described in greater detail below with reference to the following drawings, provided for the purpose of description and not of limitation, wherein:

FIG. 1, comprising

DETAILED DESCRIPTION OF PREFERRED EMBODIMENTS

Figure 1A:
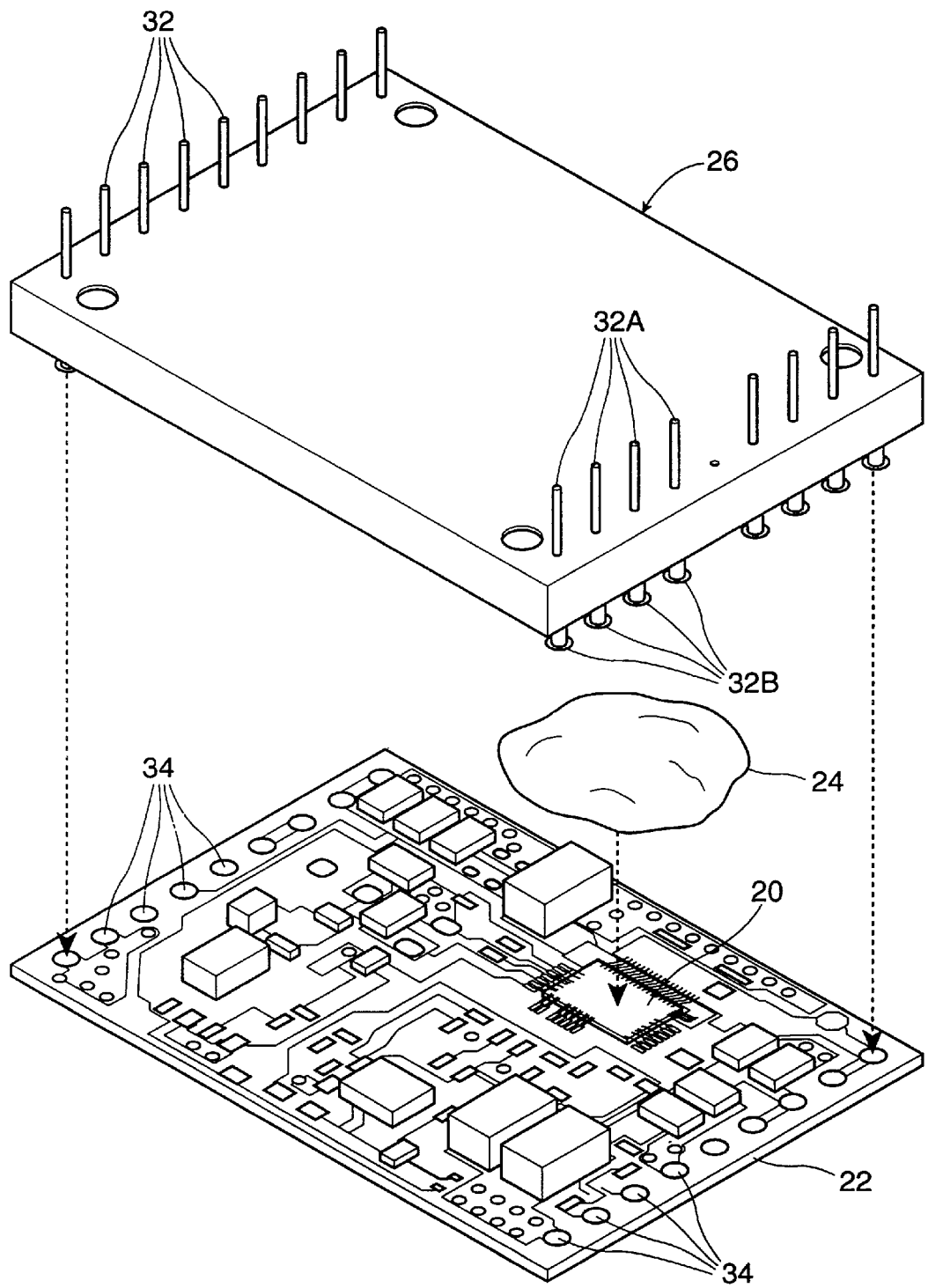
FIG. 1A and FIG. 1B, is an exploded, perspective view of an assembled PCB comprising a direct-mount IC chip and a stacked header, FIG. 1A being taken from above and FIG. 1B taken from below.
Figure 1B:
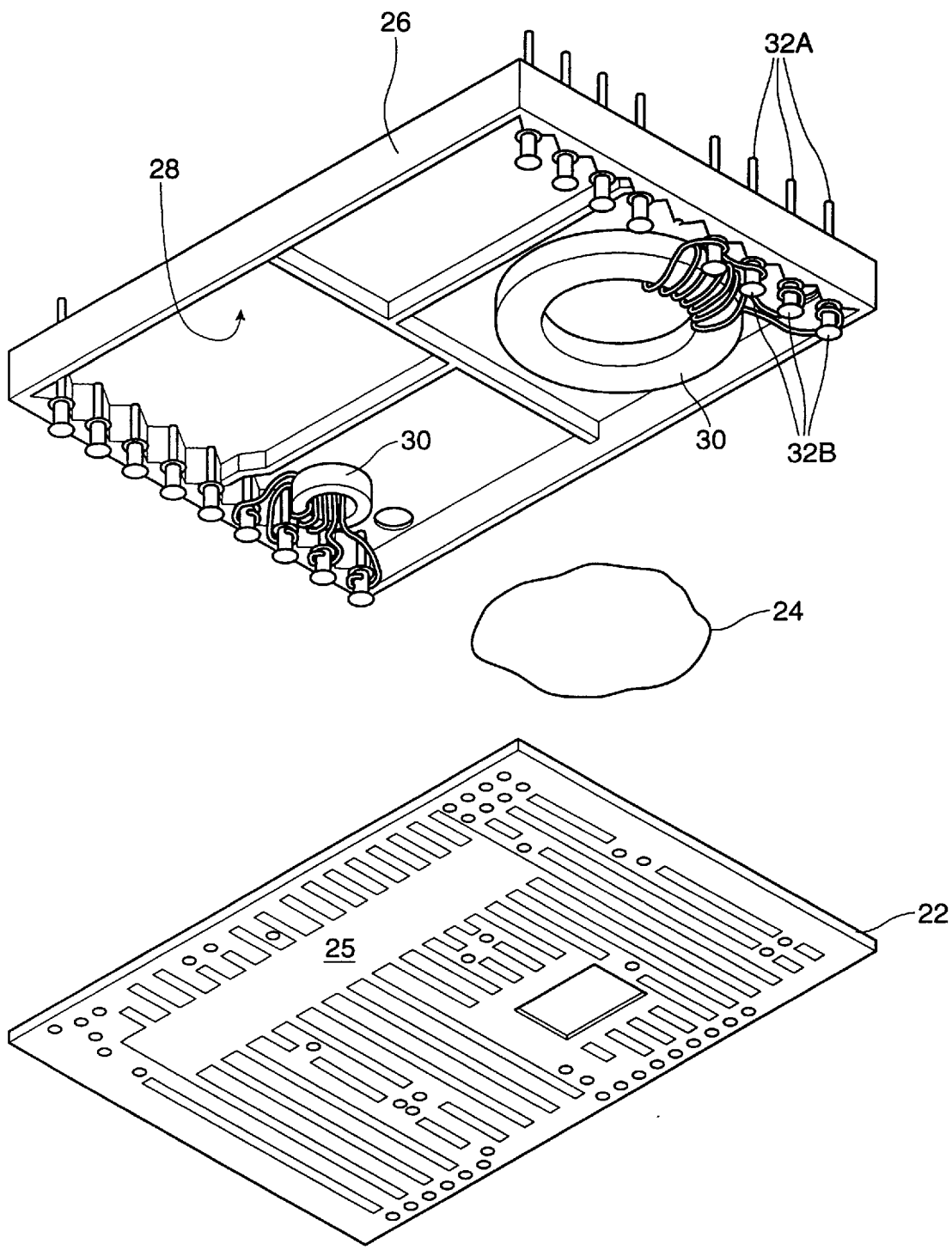
Figure 2:
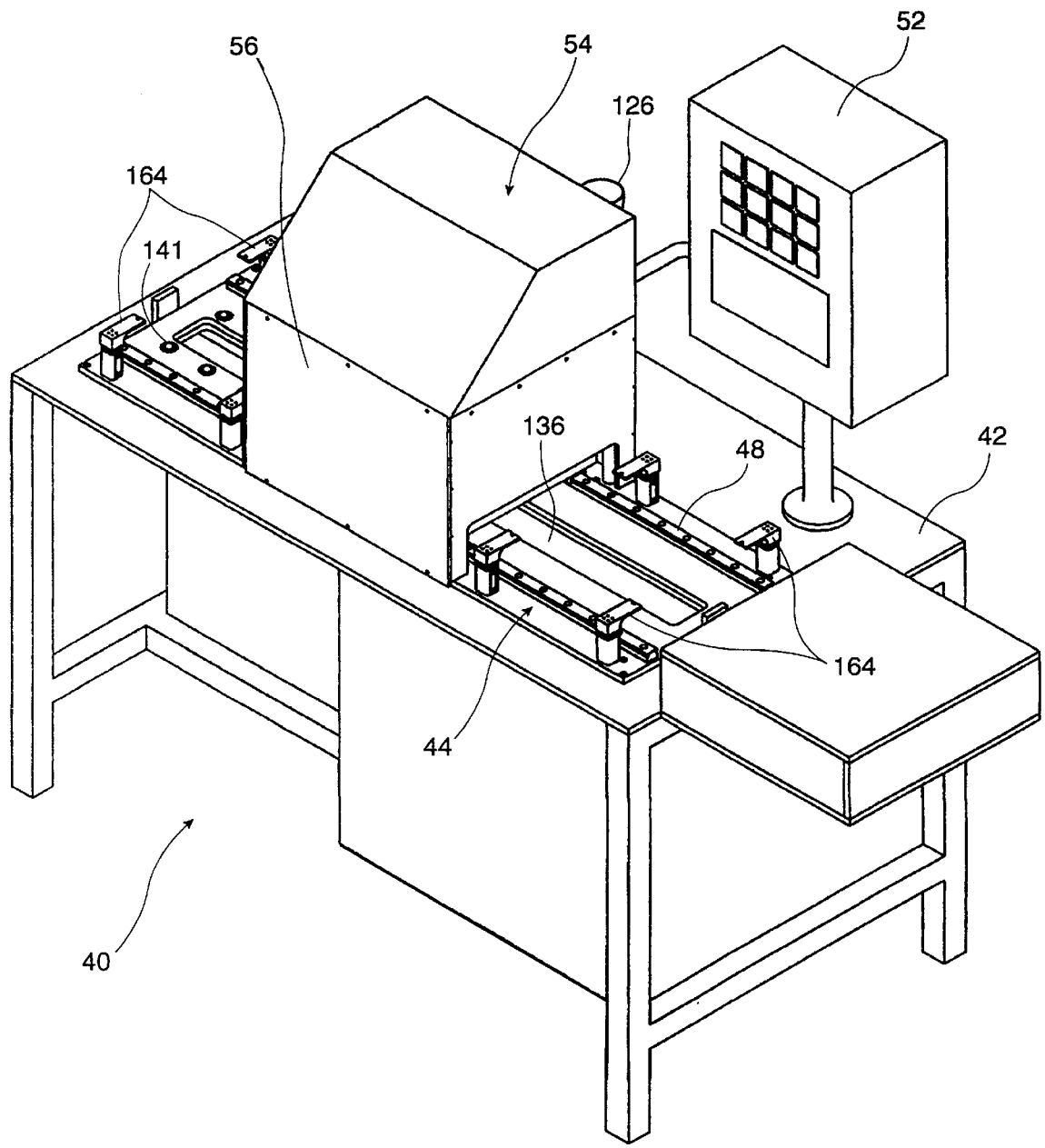
FIG. 2 is an isometric view of a PCB header attachment station in accordance with the preferred embodiment.
Figure 3:
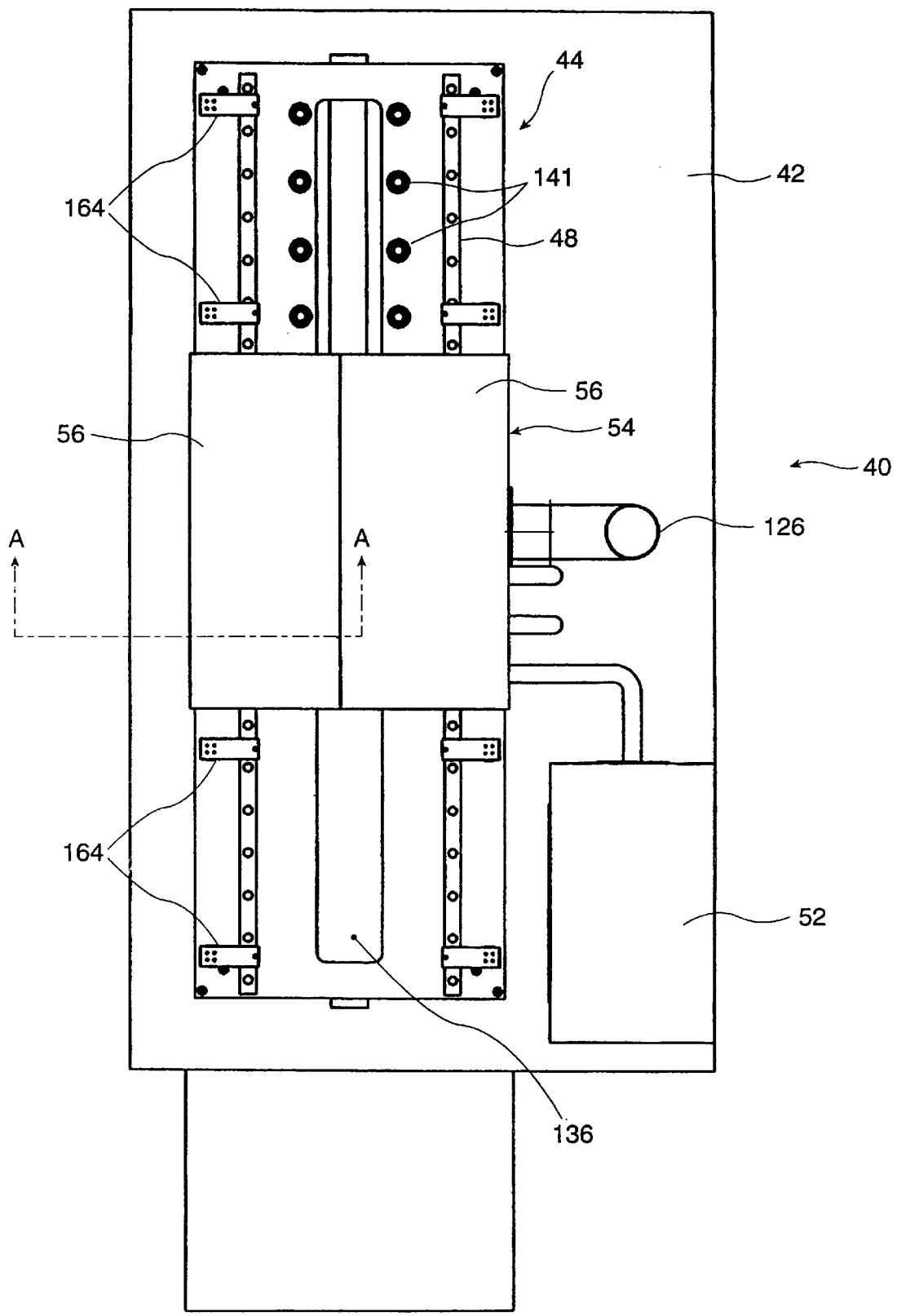
FIG. 3 is a top view of the station shown in FIG. 2.
Figure 4:
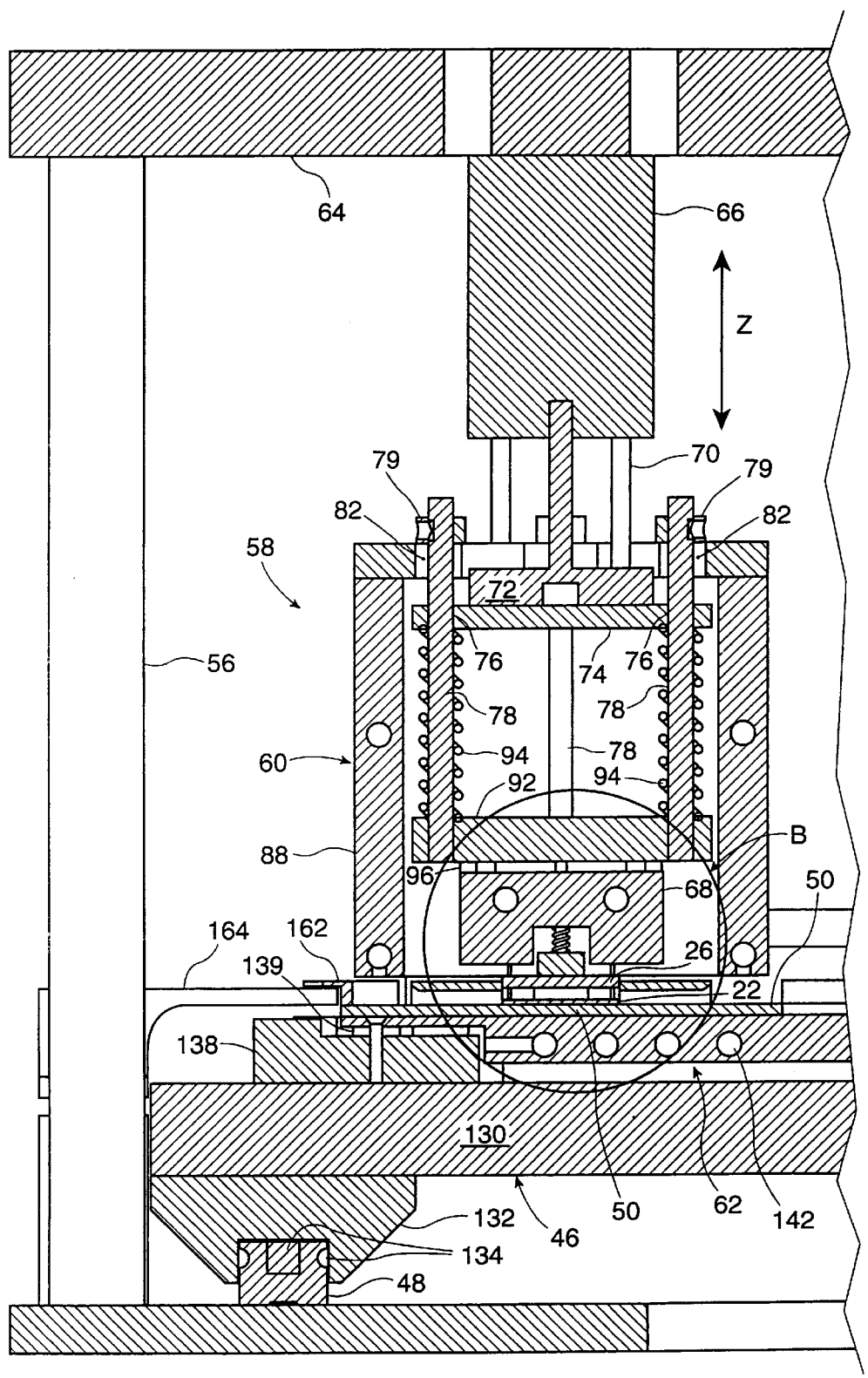
FIG. 4 is a cross-sectional view of the station taken along line A—A in FIG. 3 and showing a heating cell in operation in accordance with the preferred embodiment.
Figure 9:
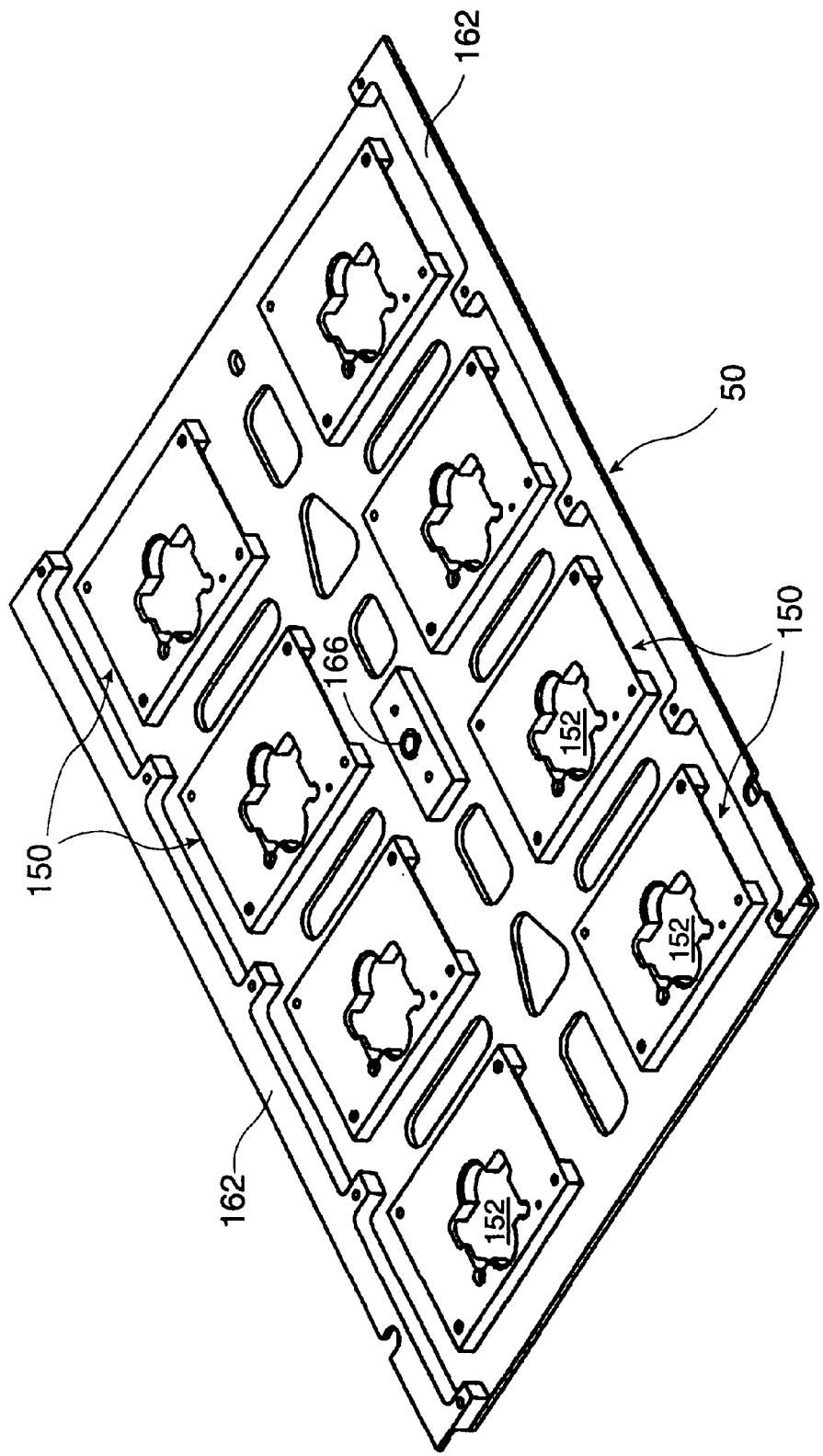
FIG. 9 is an isometric view of a carrier tray, in accordance with one embodiment of the invention, for transporting plural PCBs and header assemblies along the conveyor.
Figure 10:
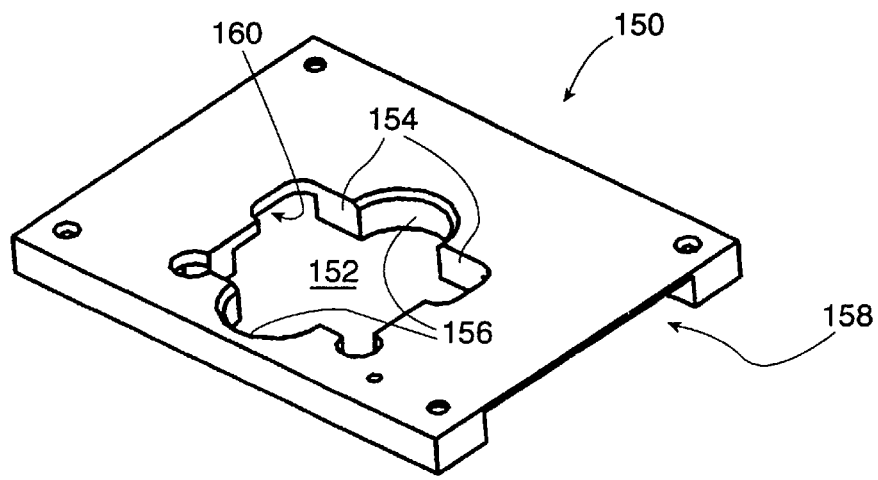
FIG. 10 is an isometric view of a PCB/header locator nest of the carrier taken in isolation.

Referring additionally to FIGS. 2, 3 and 4 an automated PCB header attachment station 40 is shown in accordance with the preferred embodiment. The major components of station 40 include a table 42; a conveyor 44 comprising a moving element or pallet 46 and a track 48; a card carrier tray 50 (FIG. 4), also shown in isolation in FIG. 9, for mounting a specific combination of PCBs 22 and headers 26 onto the pallet 46; a heating/soldering subsystem 54; and a programmable logic controller (PLC) 52 for control of the conveyor and heating/soldering subsystem. The heating subsystem 54 is encased in Lexan™ or Plexiglas™ shielding 56 and thus is not visible in the isometric view of FIG. 2 but a portion, i.e., one cell 58, of heating subsystem 54 can be seen in the cross-sectional view of FIG. 4. In addition, the heating subsystem 54 and conveyor 44 can be seen in isometric view in FIG. 6 wherein much of the shielding 56 is removed.

Figure 5:
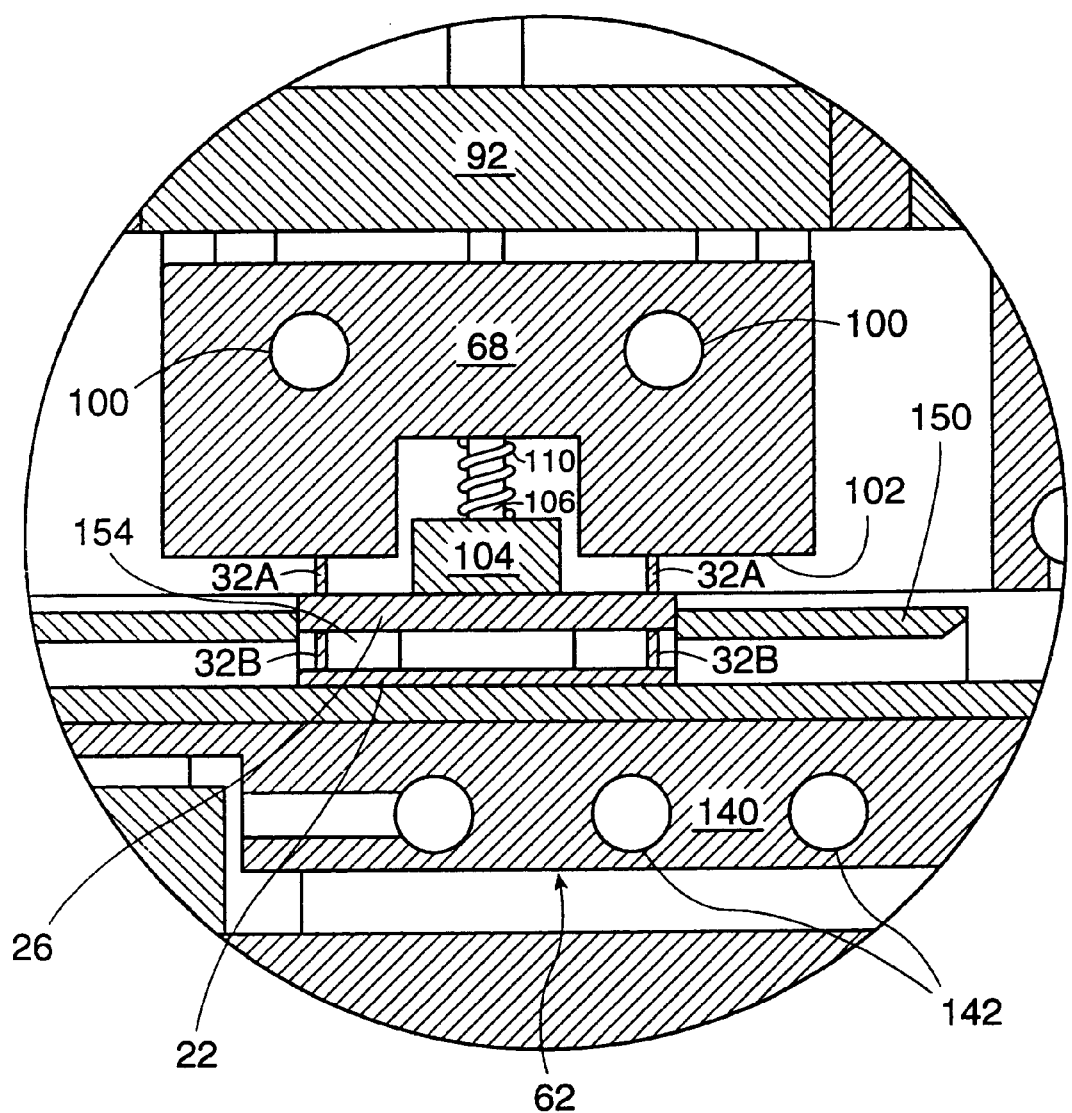
FIG. 5 is an enlarged detail view as indicated by arrow B in FIG. 4 of points of contact between a PCB, header and heating cell.
Figure 6:
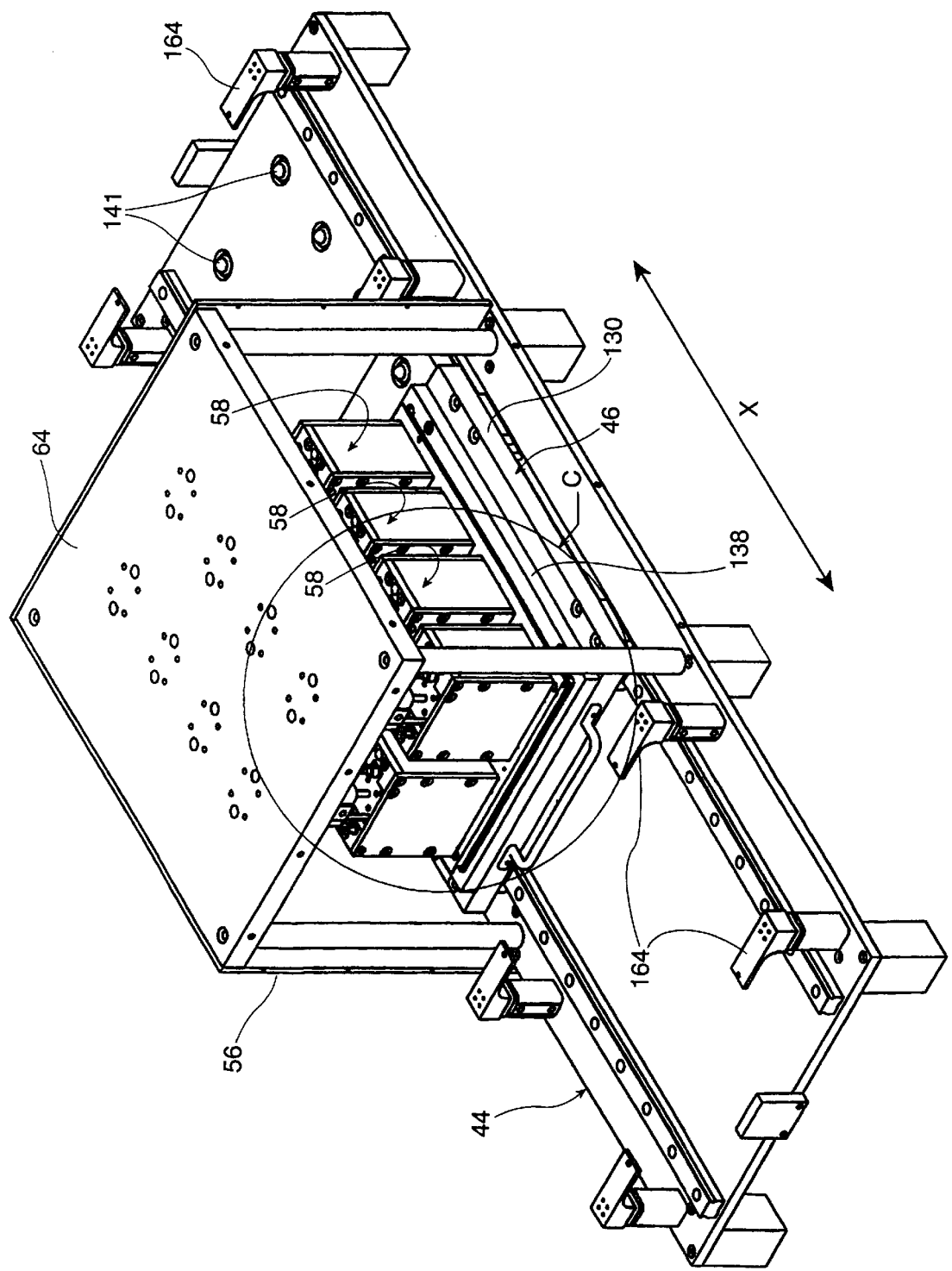
FIG. 6 is an isolated isometric view of a conveyor and a heating/soldering subsystem (comprising plural heating cells) of the station shown in FIG. 2 in operation.

Referring to FIGS. 4, 5 and 6, heating subsystem 54 comprises in the preferred embodiment eight (8) heating cells 58 (FIG. 6) which operate in unison to simultaneously attach eight headers 26 to eight PCBs 22. Each cell 58 comprises a top heater assembly 60 and a bottom heater assembly 62 (FIG. 4).

Briefly, the top heater assembly 60 comprises a frame 64 (shared by all eight cells) secured to table 42 (FIG. 6). An actuating mechanism such as a piston 66 is mounted (FIG. 4) to the frame 64 for raising and lowering a heating block 68 along a vertical axis Z. The bottom heater assembly 62 is mounted (FIG. 4) within conveyor pallet 46 and thus moves linearly along a horizontal axis X (FIG. 6) in conjunction with conveyor 44. Cells 58 enter an "operative state", i.e., ready to reflow solder paste on the header pin lands 34, when the top and bottom heater assemblies 60 and 62 thereof are aligned with one another.

More specifically, (as described in greater detail below,) the pallet 46 carries PCB 22 and header 26 in a stacked alignment for assembly to one another during solder paste reflow. The bottom heater assembly 62 is used to preheat the PCB 22 and solder paste to at least a solder paste flux activation temperature and less than a reflow temperature of solder attaching previously mounted components, including IC chip 20, to the PCB. When the stacked PCB/header assembly on pallet 46 is docked underneath (FIG. 4) the top heater assembly 60 its piston 66 is actuated to bring heating block 68 into contact with the top portions 32A of header pins 32 (seen best in the detail view of FIG. 5). The heating block 68 provides sufficient heat for conduction along the pins 32 to locally reflow solder paste on the corresponding header pin lands 34 without reflowing solder in the pre-existing joints, especially underneath the thermally constrained direct attach IC chip 20.

Figure 7:
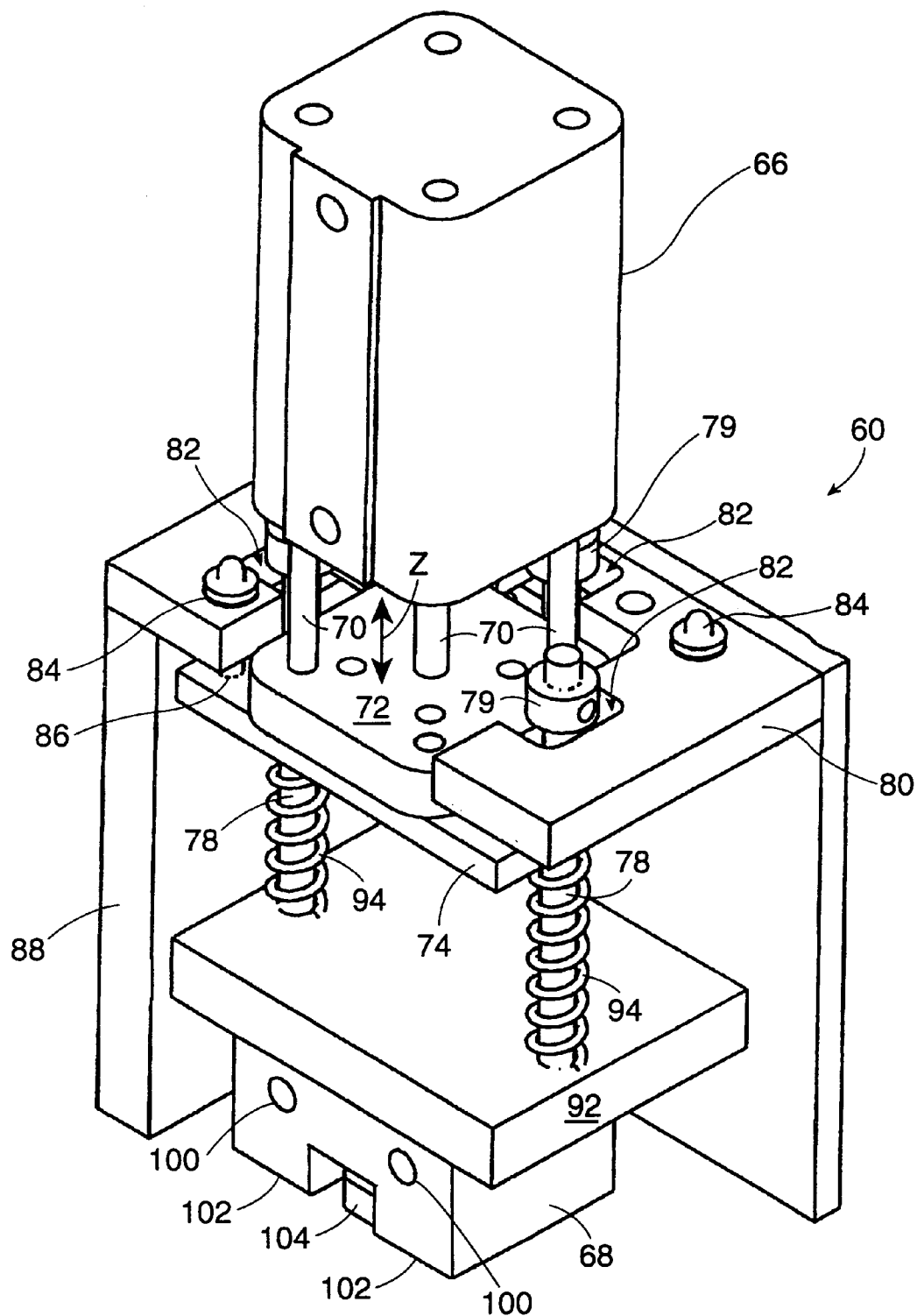
FIG. 7 is an enlarged detail view as indicated by arrow C in FIG. 6 of an upper portion of the heating cell.
Figure 8:
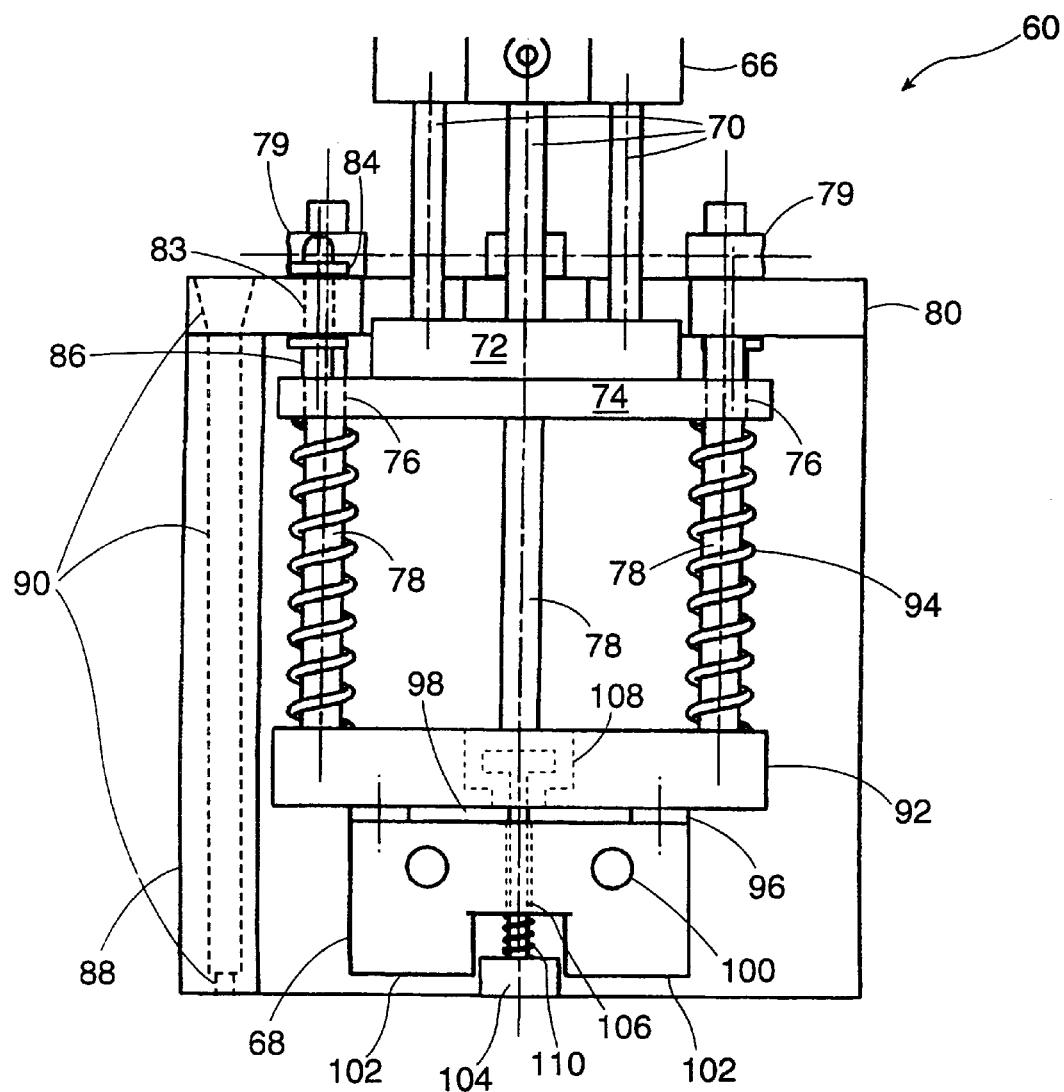
FIG. 8 is a front view of the upper portion of the heating cell shown in FIG. 7.

Referring additionally to FIGS. 7 and 8, the construction of the top heater assembly 60 for a given cell 58 is described in greater detail. The piston 66 is pneumatically actuated by valves (not shown) controlled by the PLC 52. The piston 66 includes output shafts 70 which are rigidly connected to a load plate 72 which moves linearly along vertical axis Z. The load plate 72, in turn, is rigidly connected to a press plate 74. A top cover 80 is slidingly secured to the press plate 74 by guide pins 86 which extend upwardly therefrom. The top cover 80 includes bores 83 featuring embedded bearings 84 for accepting the guide pins 86.

The press plate 74 also features a number of bores 76 (seen best in FIG. 8) through which spring guide rods 78 are permitted to slide. The rods 78 pass through rebates 82 (seen best in FIG. 7) in the top cover 80 and are capped with collars 79 at their upper ends. The collars 79 prevent the guide rods 78 from slipping through the press plate 74 when it is raised or retracted by the piston 66. The bottom ends of rods 78 are rigidly connected to a ceramic slab 92 and the heating block 68. The rods 78 carry springs 94 between the press plate 74 and the ceramic slab 92. Thus when the heating block 68 encounters an immovable object and piston 66 is actuated, the press plate 74 compresses the spring 94 which urges the heating block downward, with the rods 78 remaining stable. In this way, the heating block 68 is resiliently suspended from the piston 66 to lessen the impact between the heating block 68 and header pins 32.

The heating block 68 features legs 102 having a profile designed to contact the upper portions 32A of header pins 32, as seen best in the detail view of FIG. 5. The heating block 68 can in the preferred embodiment reach operating temperatures of over 350 degrees Celsius and thus is preferably formed from nickel plated copper to resist surface corrosion at such temperatures. Heating block 68 is rigidly connected to the ceramic slab 92 by ceramic spacers 96 (seen best in FIG. 8) to create an air gap 98. The ceramic slab 92 in conjunction with air gap 98 function as an inner heat shield to reduce heat transfer from block 68 to the piston 66, frame 64 (FIG. 6) and table 42.

A ceramic stabilizer block 104 depends from a shaft 106 slidingly mounted within a recess 108 in the ceramic slab 92 (shown only in FIG. 8). A spring 110 is fitted on the shaft 106 between heating block 68 and stabilizer block 104 in order to resiliently suspended block 104 from block 68. The stabilizer block 104 functions to press against and stabilize the body of header 26 (see FIG. 5) prior to the heating block 68 contact with header pins 32. The resilient suspension lessens the impact between stabilizer block 104 and header 26. The foregoing structure also reduces the possibility of the heating block 68 perturbing or tilting the carefully positioned header 26 due to the very thin line of contact between these elements, and on retraction provides a gentle disengagement as the heating block 68 retreats from the header 26 whose recently formed joints are still in a substantially liquid state.

A nitrogen gas manifold 88 is secured to the top cover 80. The manifold 88 features passageways 90 (seen best in FIG. 8) for the delivery of the gas to the PCB soldering site. (The gas supply hoses and manifold connectors are not shown.) The top cover 80 and manifold 88 are preferably formed from a heat resistant material and thus additionally function as heat shielding. As the top cover 80 is slidingly secured to the press plate 74, the nitrogen manifold 88 is able to translate vertically relative to the piston 66 and press plate 74 whilst still being secured thereto. An exhaust 126 (FIG. 3) is provided in the Lexan™ or Plexiglas™ shielding 56 for suction of spent nitrogen gas.

Figure 12:
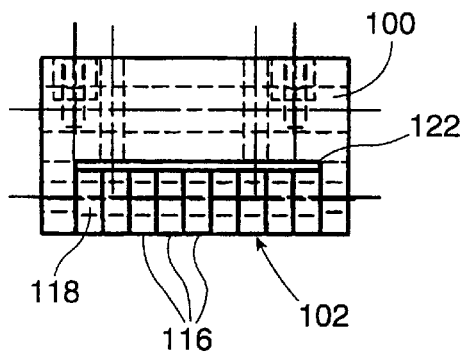
FIG. 12 is a side view of the heating block shown in FIG. 11.
Figure 11:
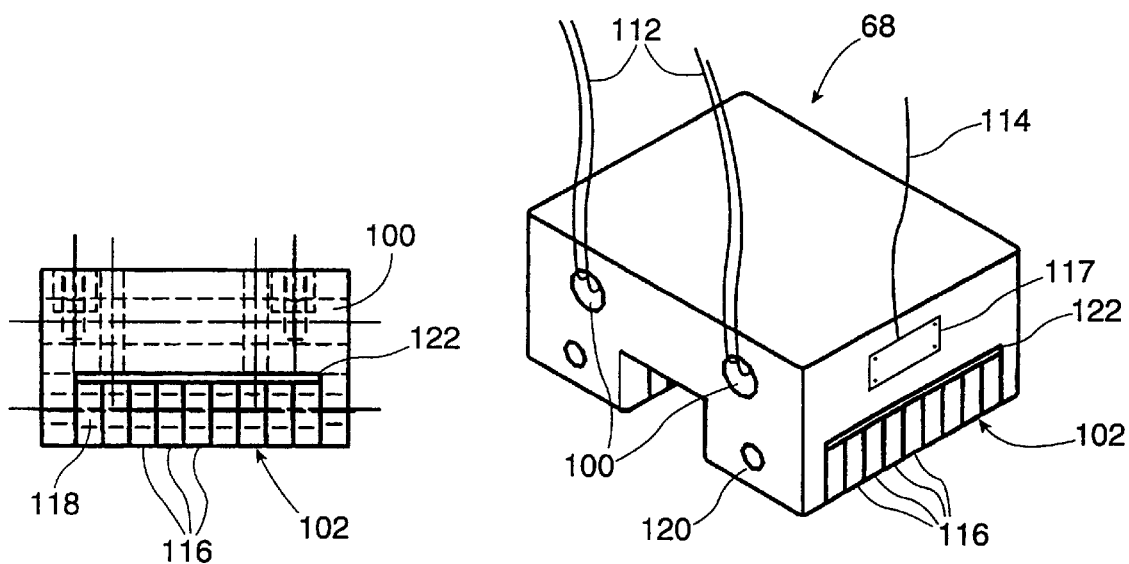
FIG. 11 is an isometric view of a preferred embodiment of a heating block employed in the heating cell.

The heating block 68 is shown in isolation and in greater detail in FIGS. 11 and 12. Each pin-contacting leg 102 of heating block 68 preferably comprises a series of individual teeth 116 configured so that each tooth contacts a separate header pin 32. A linking bore 118 is formed through the aggregate of teeth and a pin 120 is loosely fitted into the bore 118 to secure the teeth 116 to the block 68 yet allow some vertical play to each tooth. An elastically compressible thermally conductive pad 122, such as a Thermagon™ brand pad available from Thermagon Inc. of Cleveland, Ohio, is sandwiched between teeth 116 and heating block 68. In this way the teeth 116 are resiliently suspended from the block 68 to further cushion the impact between the teeth and header pins 32. The foregoing structure also enables the pin-contacting legs 102 of heating block 68 to comply to small irregularities in the level or height of the header pins 32 in order to ensure good heat transfer contact between these members.

The heating block 68 includes bores 100 for the insertion of a heater core, such as part no. E1J42-G36C38H from the Watlow Electric Manufacturing Company of St. Louis, Mo. The heater core wires 112 are connected to the PLC 52 which controls the current therethrough. In addition, a thermocouple 114 is mounted to the heating block 68 via a sandwich plate 117. The thermocouple 114 is also connected to the PLC 52 to establish a thermal control circuit.

The conveyor 44 and embedded bottom heater assembly 62 are described in greater detail with reference to FIGS. 4, 6, 9 and 10. The conveyor pallet 46 comprises an undercarriage 130 having runners 132 (FIG. 4) which include heat insulative bearings 134 for gliding the pallet 46 along the track 48. A drive means (not shown) is connected to the PLC 52 for the linear translation of the carriage 130. The drive means may include any of a number of known drive mechanisms, including a motor controlled rack and pinion mechanism; a belt drive; or a linear motor. The drive means in the preferred embodiment comprises a pneumatically actuated piston disposed in a cutout 136 (FIG. 3) of table 42. A magnet is provided on a moving end of the piston and a complimentarily polarized spaced-apart magnet is provided on the undercarriage 130 in order to magnetically interlock these members and impart translational motion to the undercarriage. This contactless structure minimizes heat transfer to the drive means.

The pallet 46 includes a heat insulative pan 138 mounted (FIG. 6) atop undercarriage 130. The bottom heater assembly 62 is mounted to the pan 138 via ceramic spacers 139 (FIG. 4). The bottom heater assembly 62 comprises a nickel plated copper heating block 140 (FIG. 4) having bores 142 for the insertion of the aforementioned heater cores. A series of such blocks are provided to serve as heaters for each cell 58. Thermocouples (not shown) are also connected to the heating block 140 and PLC 52.

As mentioned, the card carrier tray 50 transports PCBs 22 and headers 26 in stacked alignment on the pallet 46. The tray 50 comprises in the preferred embodiment eight PCB/header locator nests 150. Each nest 150 comprises a cutout 152 having flat wall portions 154 (FIG. 10) configured to locate the PCB 22 and header 26 in stacked alignment, i.e., first the PCB is dropped in the nest and then the header is dropped in the nest such that the header pins 32 rest atop the corresponding header pin lands 34. Oversized curved wall portions 156 are provided for the dextrous insertion or removal of the PCB/header from the nest. Rebates 158 and 160 are respectively provided in the nest and its cutout to vent the nitrogen gas provided by manifold 88 to the surface of the PCB.

The card carrier tray 50 also features side rails 162 (FIG. 9) which are situated to engage pneumatically actuated lifters 164 (FIG. 4) located at opposite ends of the conveyor 44. When the pallet 46 is in an initial position the lifters 164 are in an extended state for placement of the tray 50 thereon by the operator. The operator then actuates a "start cycle" push-button on the PLC 52 and it actuates the lifters to lower the tray 50 onto the heating blocks 140 of undercarriage 130. Key holes 166 (FIG. 9) are provided for this purpose. Upon completion of a PCB/header assembly cycle the conveyor moves the pallet 46 to a track terminating position whereupon the PLC 52 automatically actuates the lifters 164 to raise the hot tray 50 off of the heating blocks 140 and engage cooling fans 141 (FIG. 6) in order to enable the tray to cool somewhat before being removed by the operator.

Figure 13:
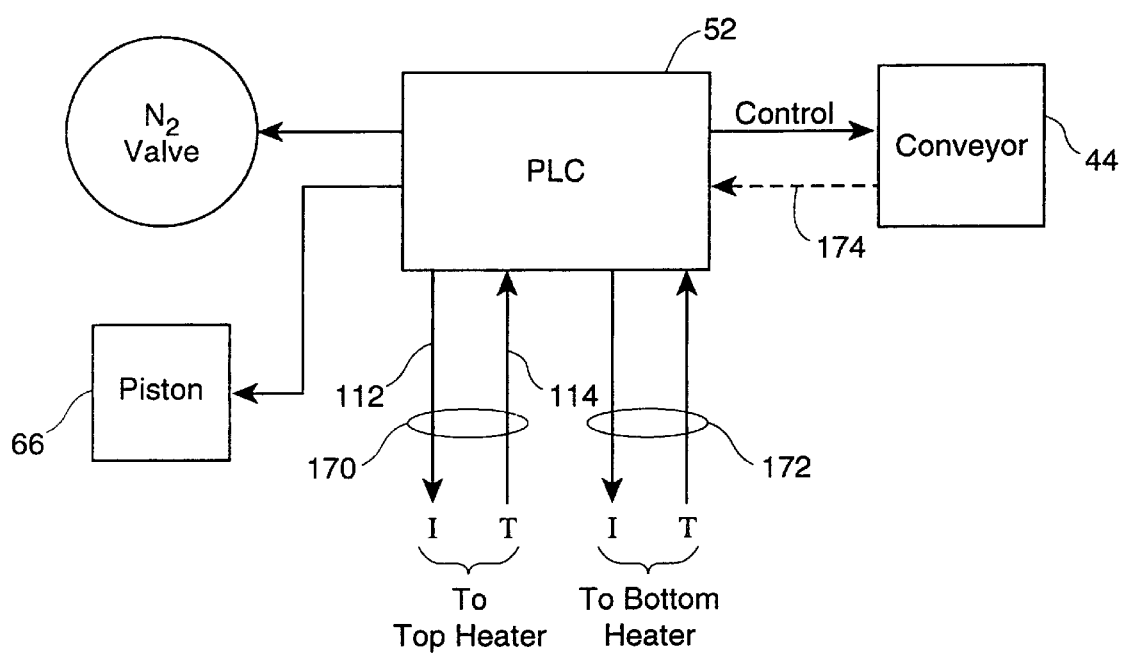
FIG. 13 is a functional block diagram of a control subsystem for the assembly station.

FIG. 13 is a functional block diagram of a control subsystem for station 40. As shown, the PLC 52 controls thermal loops 170 and 172 for the heating of the top and bottom heaters, respectively, of each cell 58. The PLC 52 also controls the pneumatics of the conveyor 44 as described above to move the pallet 46 from the initial, working to terminating positions and back. If desired, a position feedback means (not shown) may be incorporated to provide a position feedback signal 174 in order to increase the positional accuracy of the conveyor 44. The pistons 66 and nitrogen gas supply valve are likewise controlled by the PLC 52.

The PCB/header assembly process operates as follows: First, the operator loads the card carrier tray 50 with PCBs 22. The carrier tray is then brought to an automated dispenser (not shown) as known in the art per se which dispenses a prescribed amount of flux-containing solder paste onto the header pin lands 34 located on PCBs 22.

After the dispenser has applied the paste, the operator manually loads the headers 26 into the card carrier tray 50 such that each set of PCBs 22 and headers 26 are in stacked alignment with one another.

Next, the operator places the loaded tray 50 on the lifters 164 and engages the PLC "start cycle" button. The loaded tray is automatically lowered onto the pallet 46 as described above and the PCB preheating phase begins. During this phase the heating block 68 of the top heating assembly 60 is preferably heated to about 300° C., or about 120° C. above the reflow temperature of the solder paste on lands 34. In addition, the PCBs 22 are heated by the bottom heater assembly 62 to a temperature preferably 10–40° C., and most preferably 20–30° C., below the reflow temperature of solder attaching previously mounted components, including IC chip 20, to the PCB. This phase typically lasts about 10 to 80 seconds, depending on heat transfer characteristics, during which the solder paste flux activation temperature is achieved. The PLC 52 then positions the loaded tray 50 underneath the top heating assembly 60. The piston 66 of each cell 58 is then actuated. The ceramic stabilizer block 104 is the first element of the top heater assembly 60 of each cell 58 to touch and apply a light stabilizing pressure on the header 26 mounted in tray 50. The heater block 68 of assembly 60 then touches the upper portions 32A of header pins 32 and a light pressure is exerted thereon by the press plate 74 via springs 94. In the preferred embodiment the top heater block 68 is applied to the header pins 32 for approximately 100 to 180 seconds. The header pins 32 conduct sufficient heat to locally reflow solder paste on the header pin land 34 and provide a good joint without reflowing the solder in the surrounding pre-existing solder joints. In addition, heat is applied to all of the header pins 32 simultaneously such that solder paste reflows on both sides of the card and the problem of tilting is eliminated. Upon retraction of the piston 66 the stabilizing block 104 gently disengages last from the header 26 in order to avoid disturbing the recently formed hot joints.

Thereafter the conveyor 44 moves the tray 50 to the terminating position and the lifters 164 raise the tray off of the heated surface of the pallet 46. The fans 141 are then engaged and the operator may then remove the tray 50 from the assembly station 40.

Those skilled in this art will appreciate that the temperatures and heating times described herein have been provided for illustrative purposes only and will readily recognize that the heat transfer characteristic of different solder paste types will differ in each application, thereby requiring different temperature and time profiles. In addition, the sizes of the PCB and its components will vary in each application, requiring different time and temperature profiles.

The preferred embodiment has also described the application of a solder paste onto the header pin lands 34. Those skilled in the art will understand that in an alternative embodiment the lands 34 may be HASL (hot air solder level) finished, in which case either solder paste or a flux in and of itself can be applied to achieve the results of the invention. Similarly, those skilled in the art will appreciate that numerous modifications and variations may be made to the preferred embodiment without departing from the spirit and scope of the invention.

What is claimed is:

1. Apparatus for assembling a header, having one or more exposed pins, onto a printed circuit board (PCB) configured with one or more respective lands having solder and flux thereon for receiving said pins, said apparatus comprising:

a nest for locating said header and said PCB in stacked alignment;

a first heater for receiving said nest and generally heating said PCB to at least a flux-activation temperature; and a second heater comprising a heating block and an actuating mechanism for bringing the heating block in contact with said exposed header pins for a time sufficient for said pins to conduct enough heat to reflow said solder on said lands.

2. Apparatus for assembling a component, having one or more exposed pins, onto a printed circuit board (PCB) configured with one or more respective lands having solder and flux thereon for receiving said pins, said apparatus comprising:

a nest for locating said component and said PCB in stacked alignment, said PCB having pre-existing solder joints thereon;

a first heater for receiving said nest and generally heating said PCB to at least a flux-activation temperature and to a temperature approaching, but not reaching, the reflow temperature of the solder in said pre-existing joints; and a second heater comprising a heating block and an actuating mechanism for bringing the heating block in contact with said exposed pins for a time sufficient for said pins to conduct enough heat to reflow said solder on said lands, said heating block contacting said pins for a time to conduct sufficient heat to locally reflow the solder on said lands without reflowing the solder in said pre-existing joints.

3. The apparatus according to claim 2, wherein said solder and flux exist in a paste form.

4. The apparatus according to claim 2, wherein said component is a header and said first and second heaters are mounted in opposed relationship to one another.

5. The apparatus according to claim 4, wherein said heating block is resiliently suspended from said actuating mechanism for reducing the impact between said heating block and said header pins.

6. The apparatus according to claim 4, further comprising a block of thermally insulative material between said heating block and said actuating mechanism.

7. The apparatus according to claim 4, wherein said second heater comprises a member resiliently suspended from said heating block for stabilizing said header as said heating block is retracted therefrom.

8. The apparatus according to claim 4, wherein said heating block includes a plurality of teeth resiliently suspended therefrom, each tooth being configured for separate contact with an individual header pin, to thereby enable said heater block to comply to variations in the heights of said header pins.

9. The apparatus according to claim 4, further comprising a conveyor having a moving element for transporting said nest underneath said second heater, and wherein said first heater is embedded in said moving element.

10. The apparatus according to claim 9, wherein said nest is located on a carrier tray and said conveyor moving element is keyed to locate said carrier tray.

11. The apparatus according to claim 10, further comprising lifters disposed proximate to a terminating end of said conveyor for raising said carrier try off of said first heater.

12. The apparatus according to claim 2, wherein said PCB comprises a heat-dissipating backplane.

13. The apparatus according to claim 12, wherein an integrated circuit chip is thermally connected to said backplane.

14. The apparatus according to claim 2, wherein said PCB is preheated to a temperature about 10 to 40 degrees below the reflow temperature of the solder in said pre-existing joints.

15. The apparatus according to claim 2, wherein said PCB is preheated to a temperature about 20 to 30 degrees below the reflow temperature of the solder in said pre-existing joints.

16. Apparatus for assembling a component having one or more exposed pins onto a printed circuit board (PCB) having a direct attach integrated circuit mounted thereon via an existing solder joint, said apparatus comprising:

a nest for locating said component and said PCB in stacked alignment, said PCB being configured with one or more respective lands having solder and flux thereon for receiving said pins;

a first heater for receiving said nest and generally heating said PCB to a temperature approaching, but not reaching, the reflow temperature of the solder in said existing joint; and a second heater comprising a heating block and an actuating mechanism for bringing the heating block in contact with said exposed pins for a time sufficient for said pins to conduct enough heat to reflow said solder on said lands, said heating block contacting said pins for a time to conduct sufficient heat to locally reflow the solder on said lands without reflowing the solder in said existing joint.

* * * * *